(12) United States Patent
Beebe et al.

(10) Patent No.: US 8,101,942 B2
(45) Date of Patent: Jan. 24, 2012

(54) SELF-ASSEMBLED MONOLAYER BASED SILVER SWITCHES

(75) Inventors: Jeremy M. Beebe, Midland, MI (US); James G. Kushmer, Hagerstown, MD (US)

(73) Assignee: The United States of America as represented by the Secretary of Commerce, Washington, DC (US)

( * ) Notice: Subject to any disclaimer, the term of this patent is extended or adjusted under 35 U.S.C. 154(b) by 743 days.

(21) Appl. No.: 11/852,811

(22) Filed: Sep. 10, 2007

(65) Prior Publication Data

US 2008/0067555 A1 Mar. 20, 2008

Related U.S. Application Data

(60) Provisional application No. 60/845,598, filed on Sep. 19, 2006.

(51) Int. Cl.
*H01L 29/08* (2006.01)
*G11C 11/00* (2006.01)

(52) U.S. Cl. .......... 257/40; 257/212; 257/E51.003; 257/E51.008; 257/E51.025; 365/151

(58) Field of Classification Search .......... 257/E51.023, 257/E51.027, 183, 40, 212, 414, 492, E31.001, 257/E25.004, E25.009, E51.003, E51.008, 257/E51.024, E51.025; 568/57; 365/151
See application file for complete search history.

(56) References Cited

U.S. PATENT DOCUMENTS

| | | | | |
|---|---|---|---|---|
| 6,128,214 A | * | 10/2000 | Kuekes et al. | 365/151 |
| 6,198,655 B1 | * | 3/2001 | Heath et al. | 365/151 |
| 6,858,372 B2 | * | 2/2005 | Whitlock et al. | 430/270.1 |
| 2002/0176276 A1 | * | 11/2002 | Zhang et al. | 365/151 |
| 2003/0003775 A1 | * | 1/2003 | Chen | 438/800 |
| 2003/0162316 A1 | * | 8/2003 | Zangmeister et al. | 438/48 |
| 2004/0007758 A1 | * | 1/2004 | McCreery | 257/522 |
| 2004/0089882 A1 | | 5/2004 | Aono et al. | |
| 2005/0127524 A1 | | 6/2005 | Sakamoto et al. | |
| 2006/0002176 A1 | * | 1/2006 | Zhang et al. | 365/151 |
| 2006/0141245 A1 | * | 6/2006 | Stellacci et al. | 428/338 |

(Continued)

OTHER PUBLICATIONS

Terabe et al. Quantum point contact switch realized by solid electrochemical reaction. RIKEN Review No. 37 (Jul. 2001): Focused on Nanotechnology in RIKEN, pp. 7-8.*

(Continued)

*Primary Examiner* — Colleen Matthews
*Assistant Examiner* — Galina Yushina
(74) *Attorney, Agent, or Firm* — Novak Druce + Quigg LLP

(57) ABSTRACT

The present invention is a two-state switching device based on two electrodes separated by a self-assembled monolayer. At least one of the electrodes may be composed of silver and the other electrode of any electrically conductive material, such as metals, especially gold or platinum. In the high-resistance OFF state, the two electrodes are separated by an organic monolayer having sufficiently low electrical conducting as to be considered non-conductive. Application of a negative threshold bias causes a silver ion filament to grown within the monolayer and bridge the gap between the two electrodes, changing the device into a low-resistance ON state. The device may be turned OFF by application of a positive threshold bias, which causes the ionic filament to retract back into the silver electrode. The device is easy to fabricate, smaller than currently available devices, and because the only required components are silver, another electrode and a self-assembled monolayer between them, it should be possible to incorporate this switch into a variety of device geometries.

4 Claims, 2 Drawing Sheets

$V < V_{THRESHOLD}$   SWITCH IS OFF. SILVER IS METALLIC $V > V_{THRESHOLD}$   SWITCH IS OFF. SOME SILVER IS IONIC. ($Ag^0 \longrightarrow Ag^+$) $Ag^+$ MOBILE IN E FIELD.

U.S. PATENT DOCUMENTS

2006/0154467 A1* 7/2006 Hoffman et al. .............. 438/611
2006/0209117 A1* 9/2006 Parazak ........................ 347/21
2007/0252128 A1* 11/2007 Williams et al. ................. 257/2

OTHER PUBLICATIONS

Jennings et al. Self-assembled Organic Monolayer Films on Underpotentially Deposited Metal Layers. Mat. Res. Soc. Symp. Roc., vol. 451, 1997, pp. 155-160.*

Collier et al. Electronically Configurable Molecular-Based Logic Gates. Science, vol. 285, Jul. 1999, pp. 391-394.*

Haag et al. Electrical Breakdown of Aliphatic and Aromatic Self-Assembled Monolayers Used as Nanometer-Thick Organic dielectrics. J. am. Chem. soc. 1999, 121, pp. 7895-7906.*

Ohgi et al. Observation of Au deposited self-assembled monolyaers of octanethiol by scanning tunneling microscopy. Surface Science 442 (1999), pp. 277-282.*

* cited by examiner

FIG. 1A    $V < V_{THRESHOLD}$    SWITCH IS OFF. SILVER IS METALLIC

FIG. 1B    $V > V_{THRESHOLD}$    SWITCH IS OFF. SOME SILVER IS IONIC. ($Ag^0 \rightarrow Ag^+$) $Ag^+$ MOBILE IN E FIELD.

FIG. 1C    $V > V_{THRESHOLD}$    SWITCH IS ON. Ag IONS HAVE BRIDGED THE GAP BETWEEN ELECTRODES.

SELF-ASSEMBLED MONOLAYER BASED SILVER SWITCHES

CROSS REFERENCE TO RELATED APPLICATIONS

This application claims benefit under 35 U.S.C. 119 of U.S. Provisional Application Ser. No. 60/845,598 filed Sep. 19, 2006, the entire disclosure of which are hereby incorporated by reference its entirety.

TECHNICAL FIELD

The present application is directed to a switching device based upon two electrodes separated by a self-assembled monolayer. In a most preferred environment one of the electrodes must be composed of silver and the other is any electrically conductive material, such as metals, carbon or graphite, or a composite material, such as a non-conducting core coated with a conductive element e.g. metal. In a high-resistance OFF state, the two electrodes are separated by the organic monolayer. Application of a negative threshold bias causes a silver ion filament to bridge the gap between the two electrodes, changing the device into a low-resistance ON state. The device may be turned OFF by application of a positive threshold bias, which causes the ionic filament to retract back into the silver electrode. Such switches are best suited for use in memory or logic applications and are smaller in device area than the current technology standard. When fabricated in bulk, these switches provide a cost-effective alternative to traditional silicon devices.

BACKGROUND ART

U.S. Patent Publications 20050127524 entitled "Solid Electrolyte Switching Device" and 20040089882 entitled "Electronic Device Having Controllable Conductance" have emanated from the same research group as the present invention.

These two applications describes switches formed using a solid electrolyte layer that is both an ionic and electronic conductor. Examples are silver sulfide or silver selenide. A silver sulfide layer is mobile in an electronic field, and devices switched between ON and OFF states when the sulfide layer switches between bridging the gap between electrodes and not bridging that gap.

The present device differs from those described in these publications in several ways. The device does not require a mixed ionic/electronic conductor; the device of the invention uses a self-assembled monolayer to define the spacing between two electrodes; the switching speed in the inventive devices is controlled by the identity of the self-assembled monolayer and, the claimed device does not require the presence of sulfur.

Furthermore it is much more difficult to fabricate the devices described in these publications than it is to fabricate the devices of the present invention.

To fabricate the devices of the publications requires "a substrate in which surface is coated with an insulation layer; a first interconnection layer set on said substrate; an ion supplying layer set on said first interconnection layer; a solid electrolyte layer set on said ion supplying layer, an interlevel insulating layer having a via hole set to cover said first interconnection layer, said ion supplying layer, and said solid electrolyte; a counter electrode layer set to contact said solid electrolyte layer through said via hole of said interlevel insulating layer, and a second interconnection layer set to cover said counter electrode layer." See, U.S. Patent Publication 20050127524.

To fabricate the silver self-assembled monolayer switch, all that is required is formation of a self-assembled monolayer on a silver surface, followed by contacting that monolayer using a second electric conducting electrode.

SUMMARY OF INVENTION

It is an object of the present invention to provide a device capable of OFF electric conduction i.e. a switch which is small in size, Is easy to fabricate, does not require a large number of fabrication steps and uses readily available materials to fabricate the device.

It is a further object of the invention to provide a method of manufacture of such devices.

It is a further object of the invention to provide a plurality of such devices in a matrix or array for use in logic circuits.

These and other objects can be achieved by the employment of at least two electrically conductive electrodes separated by a self-assembled monolayer. In a most preferred embodiment, at least one of the electrodes must be composed of silver and other electrode can be any electrically conducting material e.g., a metal, carbon or graphite, or a composite, such as a non-conducting core covered with a metallic or electrically conductive coating. An organic monolayer can be deposited on one of the conductors e.g., on a silver conductor and the other electrode placed in contact with the monolayer so as to complete the structure. Application of a negative threshold bias will cause a silver ion filament to bridge the gap between the two electrodes changing the device into a low-resistance ON state. The device may be turned OFF by application of a positive threshold bias which cause the ionic filament to retract back into the silver electrode.

The achievement of these and other objects will become apparent with reference to the following detailed description of the preferred embodiments and with reference to the appended drawings.

BRIEF DESCRIPTION OF THE DRAWINGS

FIG. 1A, is a schematic representation wherein the switch is OFF when the voltage applied is less than the threshold voltage.

FIG. 1B, shows the switch OFF when the voltage applies is greater than the threshold voltage but the bridge between the conductors has not yet fully formed; and, FIG. 1C, shows the switch in the ON position when the voltage is greater than the threshold voltage, but that the silver ions have bridged the gap between the two electrical conductors;

DETAILED DESCRIPTION OF THE PREFERRED EMBODIMENTS

Figure 1:
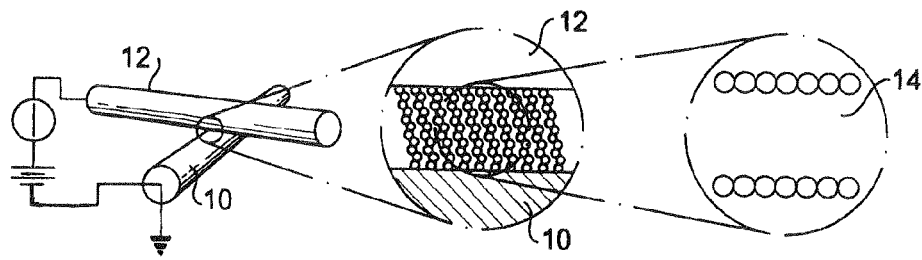
FIG. 1, is a schematic representation of a simple form of the device of the present invention.

Are shown schematically in FIG. 1 two electrodes 10, 12 are separated by a monolayer 14 of an aliphatic or aromatic organic material, which also may contain a functional group, that attaches the monolayer to the electrode.

In FIG. 1A is shown a schematic representation of the switch in the OFF condition wherein one electrode is metallic silver and the surface of the other electrode, or other electrode 12, may be selected from any electrically conducting substance, such as metals e.g., gold or platinum, or even a composite in which a non-conducting core is covered with a surface covering of a conductive metal e.g., gold or platinum.

In FIG. 1B is shown the switch in the OFF position even though the voltage bias supplied exceeds the threshold voltage, but only some silver 11 from the silver electrodes becomes ionic, but has not yet bridged the gap between electrodes 10, 12 ($Ag^O \rightarrow Ag^+$) wherein $Ag^+$ is mobile in the electric field.

FIG. 1C shows the switch in the ON condition in which the voltage bias exceeds the threshold voltage and the silver ions 11 have bridged the gap between electrodes.

Figure 2:
FIG. 2, is a graphical representation of a current-voltage response of the device shown in FIG. 1.
Figure 2:
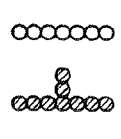
Figure 2:
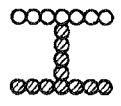
Figure 2:
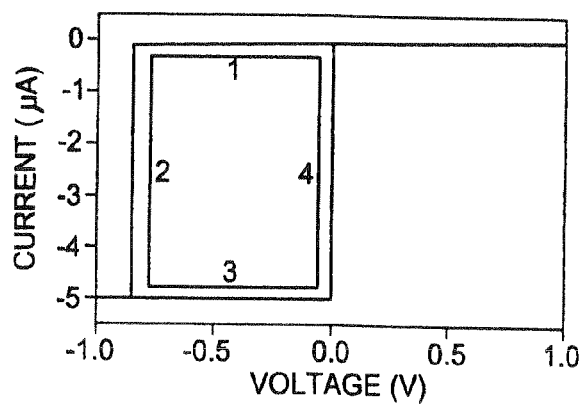

Referring now to FIG. 2 which shows the current-voltage response, the device begins in the OFF state with the bias of +1.0 V applied to the silver electrodes. At position 1 the device remains in OFF state as voltage is swept negative. At a threshold bias, shown at 2, the device switches into the ON state and the device remains in ON state as voltage is swept toward positive values as shown in 3. As shown at 4, at a threshold bias level, the device turns OFF.

Figure 3:
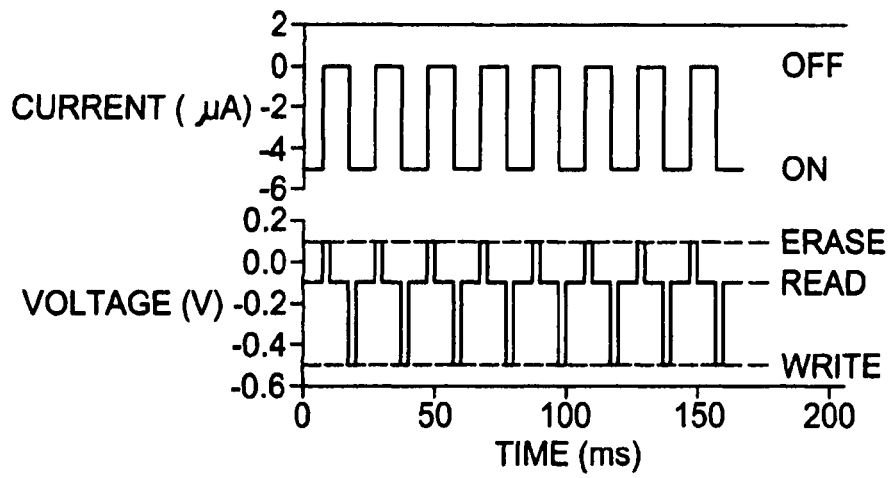
FIG. 3, shows the switching behavior of a gold/octanethiol/silver junction.

As shown in FIG. 3 which is the actual switching behavior of a Au/octanethiol/Ag junction with the current measured as voltage pulses of −0.5 V (write), −0.1 V (read), and 0.1 V (erase) are applied. One measurement cycle consists of writing, reading, erasing, and reading. The current response shown in the top portion of the figure is consistent with the device turning ON when the write voltage is applied, and OFF when the erase voltage is applied.

Figure 4:
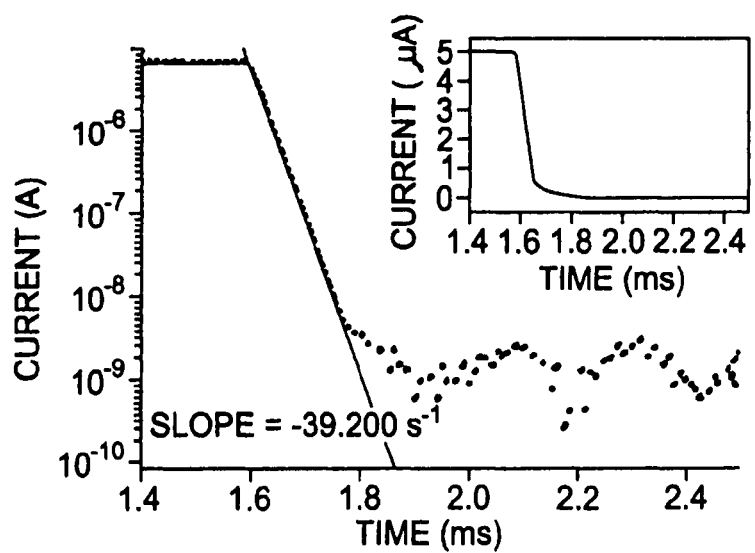
FIG. 4, is a graphical representation of a semilog plot of measured current as a function of time as the device of the invention is switched from the ON state to the OFF state.

In FIG. 4, is shown a semilog plot of measured current as function of time as the device is switched from the ON state to the OFF state. The decay constant as determined by the slope of the line is directly related to the silver ion propagation velocity and to the maximum switching rate. For octanethiol monolayer (8 carbon atoms), the maximum, switching voltage is 13 kHz, whereas octadecanethiol monolayer (18 carbon atoms), the maximum switching rate is 2 kHz.

The self-assembled monolayer switching device of the present invention is comprised of three components: a silver electrode 10, a self-assembled monolayer 11, and a second electrode 12 which can be of any metal or any other electrically conductive surface.

The device geometry can be either be a self-assembled monolayer grown on a silver surface, with a counter electrode place into contact with the monolayer, or a self-assembled monolayer on a different electrically conductive surfaces, e.g., metal surface, with a silver electrode placed into contact.

The composition of the monolayer can be satisfied by aliphatic or aromatic organic materials which have sufficiently low electrical conductivity as to be considered non-conductive, and must permit the flow of ions, such as silver ions, such as silver ions, to bridge the gap between electrodes 10, 12. Functional groups which can bond to metallic conductors are desirable, but not essential, to the composition of the monolayer.

The device is in the OFF state until a negative threshold bias is applied to the counter electrode which ionizes the silver electrode and turns the device ON (See FIGS. 1A-1C). The device remains in the ON state until a sufficient positive bias is applied to the counter electrodes.

The self-assembled monolayer may be aliphatic or aromatic, and may contain any functional group that attaches it to the metal surface. The maximum switching rate can be controlled by choice of self-assembled monolayer. Longer molecules results in slower switching rates, but more robust junctions as shown in FIG. 3.

To fabricate the silver self-assembled monolayer switch, all that is required is formation of a self-assembled monolayer on a silver surface, followed by contacting that monolayer using a second electrode or alternatively contacting the self-assembled monolayer on a metallic conducting surface and contacting it with the silver surface of the electrode.

COMMERCIAL APPLICATIONS

Figure 5:
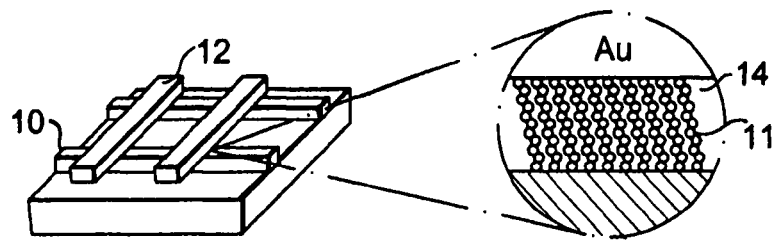
FIG. 5, is an schematic representation of the incorporation of the silver switch of the invention into a nanoscale crossbar platform.

The self-assembled monolayer silver switch operates on the nanoscale and requires little effort to fabricate. It therefore has the potential to outperform conventional silicon devices, either in terms of size or cost. Its most probable uses are as a low-cost memory element or logic element. It could also function as a nanofuse. One such use is the fabrication of a nanoscale crossbar array as shown in FIG. 5 which addressed a large number of discrete metal-molecule-metal junctions in an overall small footprint, which provides a pathway to programmable logic and addressable memory in a molecular junction. It should be possible to incorporate the self-assembled monolayer silver switch into the array as shown in FIG. 5.

In a most particularly preferred embodiment the electrode is silver while the other electrically conductor is gold or a gold covered core surface. Other conductors can be used such as platinum, or other conductive metals.

Although, we have described the invention in connection with certain preferred embodiments, it is to be expressly understood that our invention is not limited by the preferred embodiments or examples, but rather that those skilled in the art, upon reading the appended disclosure will be able to manufacture, make and use the present invention in other environments and for other purposes, without the e3xercise of inventive skill and without departing from the spirit and scope of the appended claims.

We claim:

1. An electric switch comprising:
   two electrically conducting electrodes, separated by a gap, one electrode having a silver surface; and
   an organic monolayer in the gap, in contact with each electrode, but separating said two electrodes creating an OFF state in the switch by retracting Ag filament bridging the two electrodes in an ON state.

2. The electric switch of claim 1, wherein one of the electrodes has a surface of gold or platinum.

3. The electric switch of claim 1, wherein the monolayer has functional groups which bond to metal surfaces.

4. A plurality of the electric switch of claim 1, arranged in an array to form a logic circuit.

* * * * *

UNITED STATES PATENT AND TRADEMARK OFFICE
CERTIFICATE OF CORRECTION

| | | |
|---|---|---|
| PATENT NO. | : 8,101,942 B2 | |
| APPLICATION NO. | : 11/852811 | |
| DATED | : January 24, 2012 | |
| INVENTOR(S) | : Jeremy M. Beebe and James G. Kushmerick | |

It is certified that error appears in the above-identified patent and that said Letters Patent is hereby corrected as shown below:

Title Page, Item (75) Inventors: The second inventor's name is corrected from James G. Kushmer to James G. Kushmerick.

Signed and Sealed this
Tenth Day of April, 2012

David J. Kappos
*Director of the United States Patent and Trademark Office*